United States Patent [19]

Palazzetti et al.

[11] 4,331,829
[45] May 25, 1982

[54] THERMOPHOTOVOLTAIC CONVERTER

[75] Inventors: Mario Palazzetti, Avigliana; Angioletta Boero, Turin; Francesca Demichelis, Turin; Enrica Minetti-Mezetti, Turin; Giancarlo Ferrari, Turin, all of Italy

[73] Assignees: Centro Ricerche Fiat S.p.A.; Politecnico di Torino, both of Turin, Italy

[21] Appl. No.: 193,595

[22] Filed: Oct. 3, 1980

[30] Foreign Application Priority Data

Oct. 5, 1979 [IT] Italy .............................. 68929 A/79

[51] Int. Cl.³ .......................................... H01L 31/04
[52] U.S. Cl. .................................................. 136/253
[58] Field of Search .......................................... 136/253

[56] References Cited

U.S. PATENT DOCUMENTS 3,751,303  8/1973  Kittl ..................................... 136/253
4,234,352 11/1980  Swanson ............................. 136/253

Primary Examiner—Aaron Weisstuch
Attorney, Agent, or Firm—Frost & Jacobs

[57] ABSTRACT

A thermophotovoltaic converter of the type comprising a concentrating optical system and a transducer for solar radiation provided with at least one lens and with at least one photovoltaic cell is described.

The principal feature of this converter is that the aforementioned transducer comprises at least a radiator having an irradiating surface substantially facing the sensitive surface of the photovoltaic cell and a selective filter disposed between the photovoltaic cell and the aforementioned radiator.

13 Claims, 2 Drawing Figures

THERMOPHOTOVOLTAIC CONVERTER

BACKGROUND OF THE INVENTION

The present invention relates to a thermophotovoltaic converter of the type comprising a concentrating optical system and a chamber formed by a transducer of solar radiation comprising a lens and at least one photovoltaic cell.

It is known that the sun emits energy in the form of electromagnetic radiation, the wavelengths of which lie essentially between 0.2 and 3 $\mu$m. However, silicon photovoltaic cells exhibit a high degree of efficiency substantially in the spectral range between 0.6 and 1 $\mu$m, with a maximum in the region of 0.85 $\mu$m, outside which these cells become hot and are subject to a rapid loss of efficiency.

The converters in common use are of the filter type or of the type based on a thermal principle, using in both cases an optical focusing unit.

The converters of the type with filters essentially comprise at least one filter which selects and conveys the solar radiation, the wavelengths of which lie substantially within a range of between 0.6 and 1 $\mu$m, to a silicon photovoltaic cell. The rejected radiation, which is not conveyed by said filter, is often used to strike a photovoltaic cell sensitive thereto, for example of germanium type, directly or via a subsequent filter which, in this case, selects the radiation of a wavelength lying in the region of 1.6 $\mu$m.

The converters of the second type mentioned, based on a thermal principle, essentially comprise a radiator which, when exposed to solar radiation, becomes red hot and emits radiation towards the photovoltaic cell, preferably with an emission peak matched to that of maximum sensitivity exhibited by the photovoltaic cell itself.

The above-mentioned converters have a number of disadvantages. In particular, for filter-type converters, heating of the cells occurs caused by background noise, i.e. by radiation not properly discriminated by the filters. Furthermore, there is unsatisfactory utilization of the band portion of electromagnetic radiation emitted by the sun and lying between 1.7 $\mu$m and $\infty$, and in the case where it is desired to utilize also the radiation within this band, it is necessary to provide further filters and corresponding specifically designed photovoltaic cells, with a consequent increased cost of production which, however, is not based on a corresponding increase in the efficiency of the converter.

The converters of the second type also undergo heating caused by background noise and damaging to the radiator itself. Moreover, the peak emission of the radiator is relatively low and narrow in relation to the total spectrum of solar electromagnetric radiation, in which case the associated photovoltaic cell converts a reduced percentage of the solar energy arriving at aforesaid radiator.

SUMMARY OF THE INVENTION

The object of the present invention is to devise a thermophotovoltaic converter which does not have the aforementioned disadvantages.

In accordance with the invention there is provided a thermophotovoltaic converter which comprises a concentrating optical system and a transducer for solar radiation provided with at least one lens and with at least one photovoltaic cell, characterised in that said transducer comprises at least one radiator having a radiating surface substantially facing a sensitive surface of said photovoltaic cell and a selective filter disposed between said photovoltaic cell and said radiator.

BRIEF DESCRIPTION OF THE DRAWINGS

For a better understanding of the present invention a preferred embodiment will now be described, solely as a non-restrictive example, with reference to the accompanying drawing, in which.

DETAILED DESCRIPTION OF THE INVENTION

Figure 1:
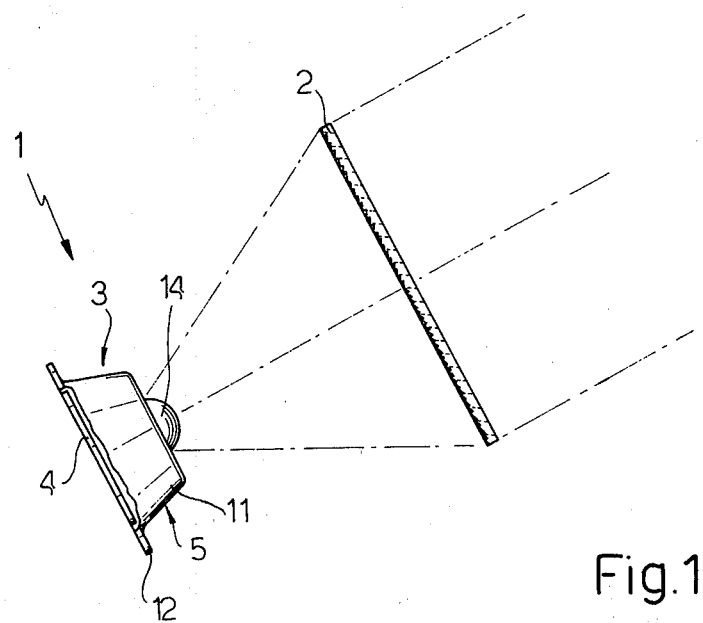
FIG. 1 is a side view partly in section of a thermophotovoltaic converter designed in accordance with the present invention.
Figure 2:
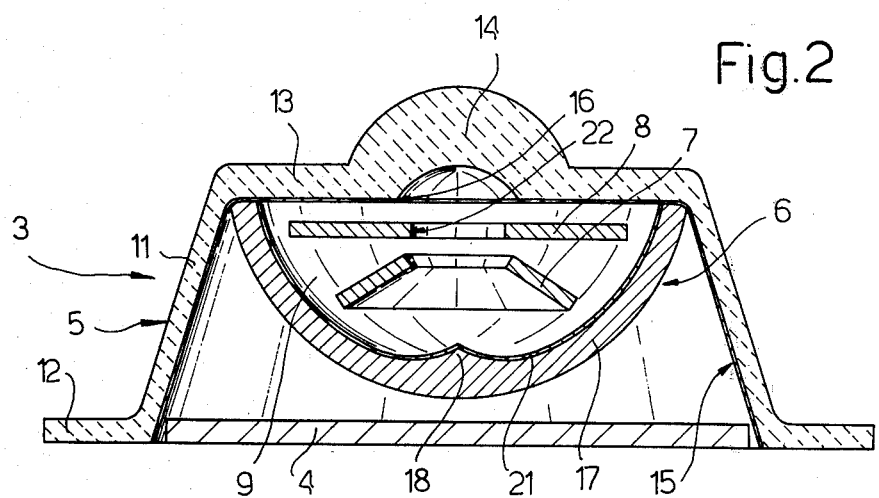
FIG. 2 is a sectional view on an enlarged scale of a detail of FIG. 1.

Referring to FIG. 1, the numeral 1 denotes in its entirety a thermophotovoltaic converter comprising a lens 2 capable of concentrating through a transducer 3 the electromagnetic radiation emitted by the sun on to a photovoltaic cell 4. The transducer 3 (FIG. 2) comprises a substantially cup-shaped body 5, a filter 6 and a pair of radiators 7 and 8. The body 5 and the filter 6 define internally a chamber 9 which accommodates the radiators 7 and 8 and, preferably, is maintained under vacuum. The body 5 has a frustoconical side wall 11 which, at its largest cross-section, widens into an outwardly extending radial rim 12. At its smallest cross-section, the body 5 has a base wall 13 which has in its central portion a holoaplanatic meniscus lens 14 substantially of hemispherical shape and with its concavity facing towards the interior of the transducer 3. Preferably, said lens 14 is made of glass and is provided with a layer of anti-reflecting material (not shown in the attached drawings) on its surface facing the lens 2. The body 5, which may be made of quartz or metal, has on its inside, more precisely on the internal surfaces of the walls 11 and 13, a layer 15 of reflecting material, which is preferably gold-plated and provided with a circular aperture registering with the lens 14. The filter 6, which is disposed between the photovoltaic cell 4 and the lens 14, comprises a a lens 17 substantially of hemispherical shape with its concavity turned towards the inner surface of the wall 13. Said lens 17 has on its inner surface a raised zone 18 which, in the sectional view in FIG. 2, is of cuspidate shape. The filter 6 further comprises a layer 21 of material which is selective for a predetermined frequency band of electromagnetic radiation and which is deposited on the surface of the lens 17 facing the inner surface of the wall 13. The radiator 7, preferably made of tungsten, zirconium or ytterbium oxide, is essentially funnel-shaped and is arranged between the filter 6 and the lens 14 so that its concavity is turned towards the lens 17. The radiator 8, which is essentially of annular shape and is preferably made of nickel-chromium steel, is disposed between the base wall 13 and the radiator 7 and has a central hole 22 registering with the lens 14, so as not to obstruct the flow of electromagnetic radiation from the lens 14 towards the filter 17 and thus the cell 14. The aforementioned lenses 2, 14 and 17 are made of material which, in particular, does not impede the passage of solar radiation, the wavelengths of which lie between 0.6 and 1 $\mu$m.

The mode of operation of the thermophotovoltaic converter 1 designed in accordance with the present invention is as follows:

Electromagnetic radiation having a wavelength of between 0.6 and 1 $\mu$m through the filter 6 and strikes the photovoltaic cell 4. The rejected radiation, more precisely that having a wavelength lying between the ranges 0.2÷0.6 $\mu$m and 1÷3 $\mu$m, is repelled towards the radiator 7. This latter becomes red hot and irradiates in accordance with Planck's law of radiation a spectrum lying between 0 and $\infty$. This latter radiation is selected by the filter 6 which again only allows the passage of radiation lying between 0.6 and 1 $\mu$m, thus repelling towards the radiator 7 the rejected radiation and so on. The radiator 8 captures the radiation rejected by the filter 6 and impinging upon the radiator 7, and also the latter irradiates in accordance with the Planck's law of radiation, as indicated above. Any radiation which does not strike the pair of radiators 7 and 8 does not pass through the body 5, since it is repelled by the layer 15.

The advantages derived from the present invention are evident from the preceding description.

In particular, the electromagnetic radiation emitted by the sun, the wavelengths of which lie substantially within the ranges 0.2÷0.6 and 1÷3 $\mu$m, consequently that rejected by the filter 6, is converted by the radiators 7 and 8 as well as the filter 6 into radiation having a wavelength lying substantially between 0.6 and 1 $\mu$m. Therefore, the silicon photovoltaic cell 4 is only subjected to radiation between 0.6 and 1 $\mu$m and in a quantity which is greater than that which it would receive directly from the sun, with a resultant considerable increase in the overall transducing efficiency.

Finally, it is obvious that without departing from the scope of the present invention it is possible for modifications and variations to be made to the described and illustrated embodiment of this invention.

We claim:

1. A thermophotovoltaic converter comprising a transducer of solar radiation provided with at least one lens; and at least one photovoltaic cell; characterized in that said transducer comprises at least one radiator having an irradiating surface substantially facing a sensitive surface of said photovoltaic cell turned towards the interior of said transducer, a selective filter being disposed between said photovoltaic cell and said radiator, wherein said filter comprises an auxiliary lens of substantially hemispherical shape which is provided with a layer of optical selective material deposited on the side facing said irradiating surface of said radiator.

2. A thermophotovoltaic converter according to claim 1, characterized in that said auxiliary lens is connected fluid tightly to a body containing said transducer and defines with said body a chamber inside which said radiator is accommodated.

3. A thermophotovoltaic converter according to claim 2, characterized in that said chamber is kept under vacuum.

4. A thermophotovoltaic converter according to claim 2, characterized in that the inner surface of said container body is covered with a metallic layer of reflective material.

5. A thermophotovoltaic converter according to claim 1, characterized in that said layer of optical selective material allows the passage of radiation lying within a suitable band of solar radiation and reflects radiation outside this band.

6. A thermophotovoltaic converter according to claim 1, characterized in that said auxiliary lens has a central, substantially raised zone disposed on said surface facing said irradiating surface of said radiator.

7. A thermophotovoltaic converter according to claim 1, characterized in that said radiator is funnel-shaped with its largest cross-section turned towards said selective filter.

8. A thermophotovoltaic converter according to claim 1, characterized in that said radiator comprises tungsten.

9. A thermophotovoltaic converter according to claim 1, characterized in that said radiator comprises zirconium.

10. A thermophotovoltaic converter according to claim 1, characterized in that said radiator comprises ytterbium oxide.

11. A thermophotovoltaic converter according to claim 1, characterized in that said transducer comprises a substantially annular auxiliary radiator arranged between said radiator and said lens.

12. A thermophotovoltaic converter according to claim 11, characterized in that said auxiliary radiator comprises nickel-chromium steel.

13. A thermophotovoltaic converter according to claim 1, characterized in that said photovoltaic cell is of the silicon type.

* * * * *